United States Patent
Tsui et al.

(10) Patent No.: US 11,283,020 B1
(45) Date of Patent: Mar. 22, 2022

(54) ADDITIVELY MANUFACTURED RESISTIVE SWITCH

(71) Applicant: UNM RAINFOREST INNOVATIONS, Albuquerque, NM (US)

(72) Inventors: Lok-kun Tsui, Albuquerque, NM (US); John Bryan Plumley, Albuquerque, NM (US); Fernando Garzon, Santa Fe, NM (US); Benjamin J. Brownlee, WPAFB, OH (US); Thomas L. Peng, WPAFB, OH (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 72 days.

(21) Appl. No.: 16/792,054

(22) Filed: Feb. 14, 2020

Related U.S. Application Data

(60) Provisional application No. 62/806,621, filed on Feb. 15, 2019.

(51) Int. Cl.
  *H01L 45/00* (2006.01)
  *G11C 13/00* (2006.01)
  *B33Y 80/00* (2015.01)

(52) U.S. Cl.
  CPC .......... *H01L 45/1633* (2013.01); *B33Y 80/00* (2014.12); *G11C 13/0011* (2013.01); *H01L 45/146* (2013.01); *H01L 45/148* (2013.01)

(58) Field of Classification Search
  CPC ............. G11C 13/0011; H01L 45/1633; H01L 45/146; H01L 45/148; B33Y 80/00
  See application file for complete search history.

(56) References Cited

U.S. PATENT DOCUMENTS

| | | | |
|---|---|---|---|
| 9,112,145 B1* | 8/2015 | Lu | H01L 45/145 |
| 2009/0301894 A1* | 12/2009 | Ehlers | C25D 5/10 205/170 |
| 2014/0291600 A1* | 10/2014 | Chu | H01L 45/1233 257/4 |
| 2017/0133587 A1* | 5/2017 | Petz | C23C 16/40 |
| 2017/0179472 A1* | 6/2017 | Allie | H01M 4/505 |
| 2019/0181337 A1* | 6/2019 | Pillarisetty | H01L 27/2436 |

* cited by examiner

*Primary Examiner* — Jerome Leboeuf
(74) *Attorney, Agent, or Firm* — MH2 Technology Law Group LLP

(57) ABSTRACT

An resistive switch having a first platinum layer, an electrolyte layer that is formed by extrusion based additive manufacturing, a silver layer, and a second platinum layer, and methods of manufacturing and using the resistive switch.

9 Claims, 9 Drawing Sheets

ADDITIVELY MANUFACTURED RESISTIVE SWITCH

PRIORITY

This application claims priority to provisional U.S. Patent Application Ser. No. 62/806,621 filed Feb. 15, 2019, the disclosure of which is herein incorporated by reference in its entirety.

GOVERNMENT INTEREST

This invention was developed under Air Force Research Lab contract FA9453-16-D-0004 awarded to the University of New Mexico and the Utah State University Space Dynamics Laboratory. The U.S. Government has certain rights to this invention.

TECHNICAL FIELD

The subject matter described herein relates generally to resistive switches and, more particularly, to resistive switches including additively manufactured layers.

BACKGROUND

Standard rewriteable non-volatile memory and electronically controlled solid-state electrical switch technologies can be limited in the extent they are amenable to micronization and tolerant of stray electric or magnetic fields. This is because such technologies typically operate by managing how electrical charge and magnetic polarizations are distributed within a component. Since the desired electrical charge or magnetic polarizations in a component can be undesirably perturbed by stray electric and magnetic fields, typical non-volatile memory and solid-state electrical switches can be disrupted or damaged by such fields. Moreover, the micronization of electrical charge and magnetic polarization distributions can be limited by the inherent electric and magnetic fields these distributions possess since these inherent fields can cause undesired reordering, thus erasing the desired distributions, if the charged or polarized species in the distributions are brought too close. Alternatives to the traditional rewriteable non-volatile memory and electronically controlled solid-state electrical switch technologies have continued to be studied and sought after.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

Ionic/electrochemical resistive switches have been studied as an alternative component in reconfigurable semiconductor devices, next generation non-volatile memory (resistive random access memory) and neuromorphic computing.

In an embodiment, there is a resistive switch comprising: a first layer comprising platinum; a second layer comprising a solid-state electrolyte that is additively extruded on the first layer; a third layer comprising silver deposited on the third layer; and a fourth layer comprising platinum disposed on the fourth layer.

In an embodiment, there is a method of using a resistive switch comprises: providing a resistive switch; applying a voltage between the first platinum layer acting as a first electrode and the silver layer acting as a second electrode; and growing a silver filament by silver ion migration in the silver iodide electrolyte layer. The resistive switch further comprises: a first platinum layer; a silver iodide electrolyte layer additively extruded on the first platinum layer; a silver layer deposited on the silver iodide electrolyte layer; and a second platinum layer deposited on the silver layer.

In an embodiment, there is a method of fabricating a resistive switch comprises: forming a first electrode comprising platinum; using extrusion printing to additively manufacture a AgI layer on the first electrode; forming a second electrode comprising a silver layer on the AgI layer; and forming a platinum layer on the second electrode. In another embodiment, extrusion printing to additively manufacture a AgI layer on the first electrode further comprises: providing a AgI ink for extrusion printing; using a nozzle to print the AgI layer using the AgI ink; drying the AgI layer that was printed; and removing a binder from the AgI layer by heat treating.

Advantages in using resistive switches include a greater potential for miniaturization, low power requirements, high speed transitions, high endurance, and radiation hardness. Resistive switches have higher current density as compared to semiconductor devices. Using extrusion-based additive manufacturing techniques to form the solid-state AgI electrolyte layer in the resistive switches promote ionic conductivities within the electrolyte layer, and allows the resistive switches to efficiently transition between a low and high electrical conductivity state as desired.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIG. 1 (b) is a schematic drawing of an embodiment resistive switch that shows the layers present in the embodiment after a Ag filament has formed;

FIG. 1 (c) is an optical microscopic image of the top view of an extrusion printed embodiment resistive switch before burnout/sintering;

FIG. 2 (b) is an optical microscopic image in transmission mode of Ag filament growth from two Ag electrodes deposited on pure AgI electrode in low electrical resistive state;

FIG. 3 (b) is an optical microscopic image of the commercial AgI powder after milling;

FIG. 4 (b) is an optical microscopic image at high magnification of the printed resistive switch;

FIG. 5 (b) is a plot that shows ionic conductivity as a function of Al$_2$O$_3$ concentration;

FIG. 5 (c) is a plot of ionic conductivity as a function of temperature for pure AgI and AgI with 20% and 40% Al$_2$O$_3$ content;

FIG. 6 (b) is a plot of initial filament formation based on AgI thickness as a function of time;

FIG. 7 (b) is a plot of distribution of resistivity data for the pure AgI device in FIG. 7 (a);

FIG. 7 (c) is a plot of measured high and low resistivities for a AgI—Al$_2$O$_3$ device for 1,600 cycles; and FIG. 7 (d) is a plot of distribution of resistivity data for the AgI—Al$_2$O$_3$ device in FIG. 7 (c).

Figure 1A:
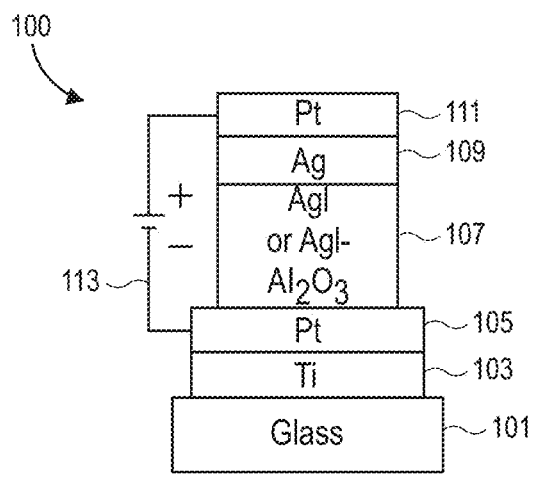
FIG. 1 (a) is a schematic drawing of an embodiment resistive switch showing the layers that is present in the embodiment in a state of rest.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to the present examples, examples of which are illustrated in the accompanying drawings. Wherever possible, the same reference numbers will be used throughout the drawings to refer to the same or like parts.

Additively manufactured resistive switches are fundamental electronic components that addresses the need for electronic components capable of establishing and removing metal filament based electrical connections, with user defined electrical conductivity, on demand and when specific system conditions arise. The additively manufactured resistive switches described herein are applicable to the following:

Neuromorphic Engineering: The microscopic size of additively manufactured resistive switches and tunable electrical conductivity make them viable for use as inorganic analogs to electrical junctions in neuro-biological architectures.

Resistive Non-Volatile Digital Memory: The stable and persistent nature of the metal filaments formed and erased in additively manufactured resistive switches allows these switches to be used as non-volatile random access memory where specific resistance states established by the switch can be used to represent specific elements of electronic binary code.

Low Power Non-Volatile Digital Memory: Additively manufactured resistive switches require minimal power to read and write the electrical resistance states used to represent binary code and does not consume power to store binary data.

Robust Non-Volatile Digital Memory: The uncharged metal filament based digital memory achievable with additively manufactured resistive switches is more tolerant of radiation and unexpected electric or magnetic fields than charge based digital memory.

Reconfigurable Circuitry: Additively manufactured resistive switches can be used to reconfigure logic elements in Field Programmable Gate arrays (FPGA) or electrical wiring in a circuit board.

Regenerative Fuse: Additively manufactured resistive switches can be designed to sever electrical connections when an electrical current threshold is exceeded and can regenerate this connection when the excessive electrical current conditions have subsided.

Antifuse: Additively manufactured resistive switches can be used to prevent an electrical connection from being established until a voltage threshold is exceeded.

Additively manufactured resistive switches are largely immune to undesired affects by stray electric and magnetic fields since such switches establish an electrical connection by growing a metal filament to short two electrodes or etch away such filaments to sever such electrical connections. Reconfigurable circuitry, neural networks, and Field Programmable Gate Arrays (FPGA) can be made by creating an array of resistive switches which define how electrical components or logic elements are interconnected. Non-volatile memory can be made by assigning specific electrical conductivity states resistive switches can consistently establish, on demand, as specific representations of digital memory. Regenerative fuses can be made by designing the resistive switch to break when an electrical current threshold is exceeded and utilize its filament generation capabilities to restore the filament after failures. An anti-fuse, an electrical component which only establishes an electrical connection after specific conditions are met, can be made by designing a resistive switch such that it only establishes a filament based electrical connection between two electrodes when the applied voltage exceeds a predefined threshold. Once established, the electrical connection in such anti-fuses is particularly robust since it naturally repairs any degradation in the filament linking two electrodes.

Figure 1B:
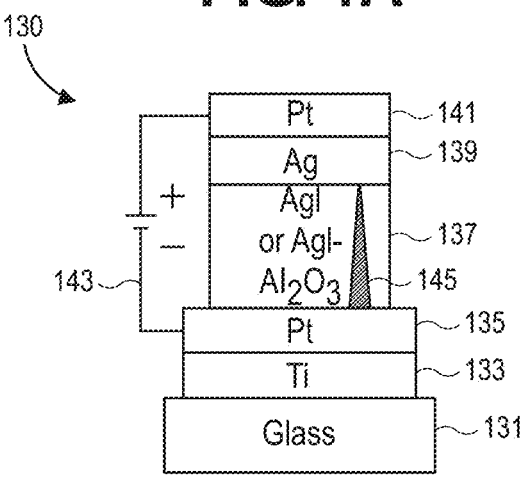
Figure 1C:
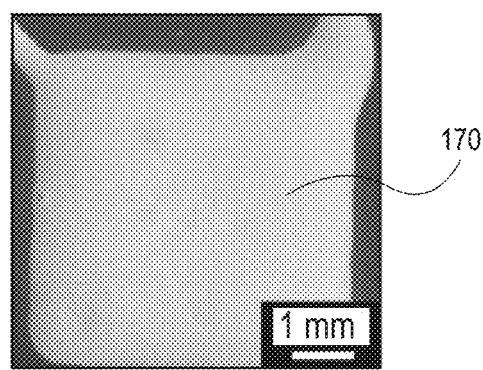

An embodiment of the additively manufactured resistive switches comprise of a resistive switch device stack composed of, listing from top down, platinum (Pt) layer, silver (Ag) layer, silver iodide (AgI) or silver iodide-aluminum oxide (AgI—Al$_2$O$_3$) composite layer, titanium (Ti) layer, and a glass substrate, such as shown in FIG. 1.

The first layer is a glass substrate 101. The glass substrate 101 functions as the base of the device 100 and provides structural support. The glass substrate 101 can be any type of insulator that would not adversely affect the resistive switch that is additively manufactured on the substrate 101. A layer of Ti 103 is first deposited on top of the glass substrate 101, the Ti layer 103 has a thickness of between about 15 nanometer (nm) to about 1 nm, preferably between about 10 nm to about 3 nm, most preferably about 5 nm. The Ti layer 103 serves as an adhesion layer which allows metals to be bound to the glass substrate 101. On top of the Ti layer 103 is a first layer of Pt 105 that has a thickness of between about 80 nm to about 15 nm, preferably between about 60 to about 40 nm, and most preferably about 50 nm. This first layer of Pt 105 serves as one of the electrodes in the resistive switch 100. On top of the first Pt layer 105 is a layer of AgI (or AgI—Al$_2$O$_3$ composite) layer 107 that has a thickness of between about 25 micron (μm) to about 50 nm, preferably between about 50 μm to about 75 nm, The AgI (or AgI—Al$_2$O$_3$ composite) layer 107 serves as a solid-state electrolyte that allows silver ion (Ag$^+$) migration needed for filament growth and etching. On top of the AgI (or AgI—Al$_2$O$_3$ composite) layer 107 is a layer of Ag 109 that has a thickness of between approximately 25 μm to about 50 nm, preferably between about 60 μm to about 40 nm, and most preferably about the thickness of the electrolyte layer. This Ag layer 109 serves as the second electrode in the resistive switch and the source of Ag used to grow a bridging filament or store Ag that was etched away when electrical connections are severed. Finally, on top of the Ag electrode layer 109 is a second layer of Pt 111 that has a thickness of between about 80 nm to about 15 nm, preferably between about 60 to about 40 nm, and most preferably about 50 nm. This second Pt layer 111, because of its inert nature, serves as an electrochemical backstop which cannot be etched away if the previous silver layer develops degrades or holes. The first Pt layer 105 and the second Pt layer 111 are configured to attach to a battery 113 that provides electrons to the resistive switch 100.

In the embodiment resistive switch 100, the active components are the Pt, AgI, Ag, and Pt layers stacked in the order listed. $Al_2O_3$ can be added to the AgI electrolyte layer to form a composite. The $Al_2O_3$ in the solid-state AgI—$Al_2O_3$ composite can further promote ionic conductivities of the electrolytes without increasing the activation energy. How this stack is aligned does not affect how the resistive switch works so long as the order in which these layers are stacked is maintained. For example, the embodiment resistive switches can be positioned, aligned, or bent to accommodate the needs of its surrounding architecture. Alternatively, the resistive switches can also be made with the active layers aligned perpendicular to the face of the glass substrate so that the stack of layers is aligned parallel to the glass. In this alternative configuration, an adhesion layer may be needed to affix the active stack of layers to the glass substrate, and material of the adhesion layer would need to be such that does not inadvertently short the electrodes in the resistive switch.

The chemical reactions which occur during resistive switch operation are as follows:

$$Ag^+ + e^- \rightarrow Ag \qquad \text{Eq. 1}$$

$$AgI + e^- \rightarrow Ag + I^- \qquad \text{Eq. 2}$$

$$Ag \rightarrow Ag^+ + e^- \qquad \text{Eq. 3}$$

$$I^- \rightarrow \tfrac{1}{2}I_2 + e^- \qquad \text{Eq. 4}$$

When it is initially fabricated, such as shown in FIG. 1 (a), the resistive switch is in a high electrical resistivity state due to the high electrical resistivity of the solid-state AgI electrolyte separating the Pt and Ag electrodes. To transition the resistive switch into the low electrical resistivity state, a voltage is applied such that the Pt electrode becomes more negative than the Ag electrode. This causes silver ions to electroplate and establish a growing silver filament on the Pt electrode via the reactions shown in Eq. 1 and Eq. 2. During this process, charge neutrality in the AgI electrolyte is maintained via the oxidative dissolution of the Ag electrode via the reaction shown in Eq. 3 or the oxidation of iodide anions (I⁻) via the reaction shown in Eq. 4.

FIG. 1 (b) shows an embodiment resistive switch 130 at a low electrical resistivity state. Resistive switch 130 is deposited on a glass substrate 131 with a Ti layer 133 as an adhesion layer, with subsequent layers deposited on top of the Ti layer 133 in the order of a first Pt layer 135, a AgI (or AgI—$Al_2O_3$ composite) layer 137, a Ag layer 139 and a second Pt layer 141, and connected to a battery/source of power 143. The low electrical resistivity state is achieved when a silver filament 145 growing on the first Pt layer/electrode 135 closes the distance between the first Pt layer/electrode 135 and Ag layer/electrode 139 to establish an electrical short between the first Pt layer/electrode 135 and Ag layer/electrode 139.

Figure 2A:
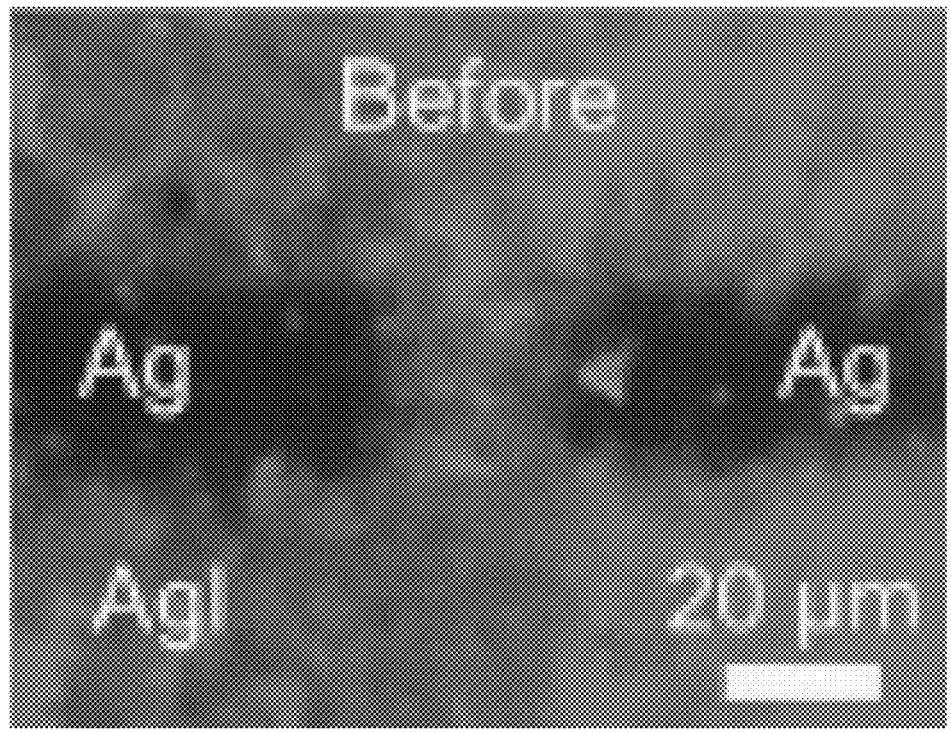
FIG. 2 (a) is an optical microscopic image in transmission mode of two Ag electrodes deposited on pure AgI electrode in high electrical resistive state.
Figure 2B:
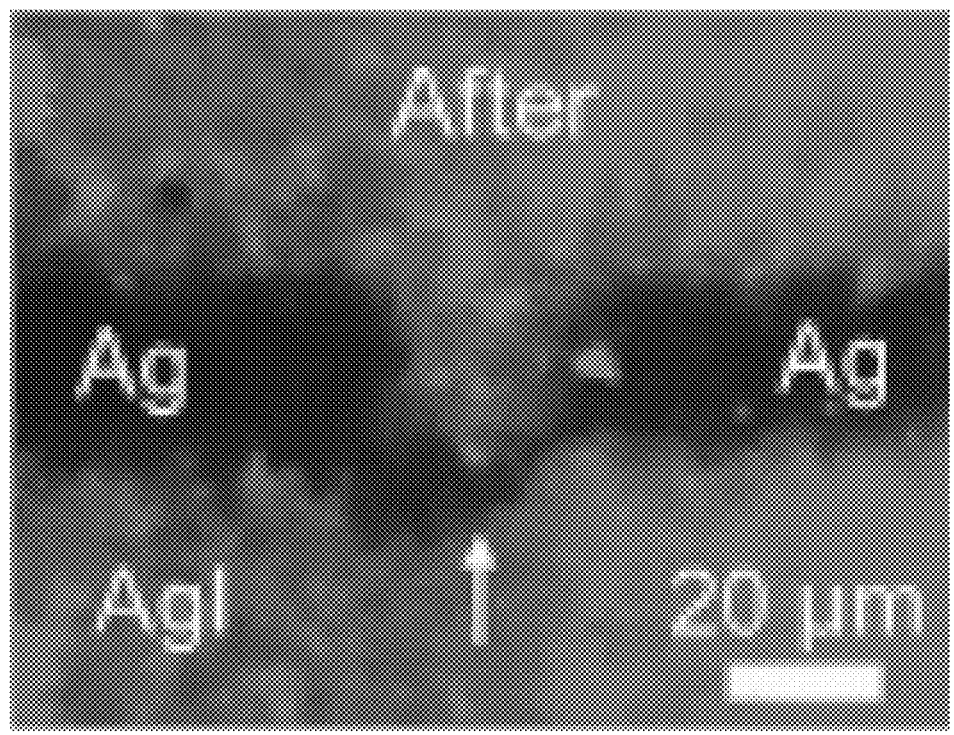

FIGS. 2 (a) and (b) show an optical microscope image of the silver filament growth that occurs in the AgI electrolyte layer. The example Ag/AgI/Ag device shown in FIGS. 2 (a) and (b) are used as examples to show how the filament is formed to bridge between electrodes. FIG. 2 (a) shows two Ag electrodes that are deposited on the Ag I electrolyte at high electrical resistive state, and FIG. 2 (b) shows the same at low electrical resistive state, after being applied a voltage from a power source, a bridge/filament has formed between the two Ag electrodes to provide a short in the device.

To return the resistive switch 130 to a high electrical resistivity state, the applied voltage from battery 143 is reversed such that the first Pt electrode 135 becomes more positive than the Ag electrode 139. This causes the oxidative dissolution of the silver filament 145 via the reaction shown in Eq. 3. To maintain charge neutrality in the AgI electrolyte layer 137 during this transition, any $Ag^+$ introduced to the AgI electrolyte layer 137 by the filament etching is matched with a corresponding loss of $Ag^+$ in the AgI electrolyte layer 137 by the electroplating of $Ag^+$ ions onto the Ag electrode layer 139 via the reduction shown in Eq. 1 or AgI decomposition via the reduction shown in Eq. 2. FIG. 1 (c) shows a microscopic view of an electron microscopic top view of an extrusion printed embodiment resistive switch, such as the ones shown in FIGS. 1 (a) and 1 (b), before burnout, at a scale of millimeters (mm). An resistive switch can have a surface width of between about 10 mm to about 1 mm, preferably between about 8 mm to about 4 mm, and most preferably between about 5 mm, and a surface length of between about 10 mm to about 1 mm, preferably between about 8 mm to about 4 mm, and most preferably between about 5 mm. Devices of other geometries are possible and application dependent For Ag filament growth and etching to occur, $Ag^+$ ions must have mobility in the solid-state AgI electrolyte. In one embodiment, the AgI is crystalline. In another embodiment, the AgI can be amorphous as the primary $Ag^+$ ions with mobility in the AgI electrolyte are the $Ag^+$ ions located at imperfections in AgI structure. Additive manufacturing can achieve the desired crystalline or amorphous structure by allowing the binding of individual AgI grains while avoiding crystallizing effects which can come with utilizing conventional clean room techniques to deposit the AgI electrolyte.

An embodiment method to manufacture resistive switches is the use of extrusion-based additive manufacturing to deposit the solid-state AgI or AgI—$Al_2O_3$ electrolyte. Extrusion-based additive manufacturing, or also known as extrusion printing, involves loading a material of interest into a syringe or nozzle, and a multi-axis print platform is used to control the deposition of the material by applying a back pressure on the syringe while moving a patter predesigned by the user in, for example, a computer-aided design (CAD) software. Additive manufacturing technique allows quick prototyping and small-scale production.

Example 1: Material Preparation of AgI—$Al_2O_3$ for Extrusion Printing

Figure 3A:
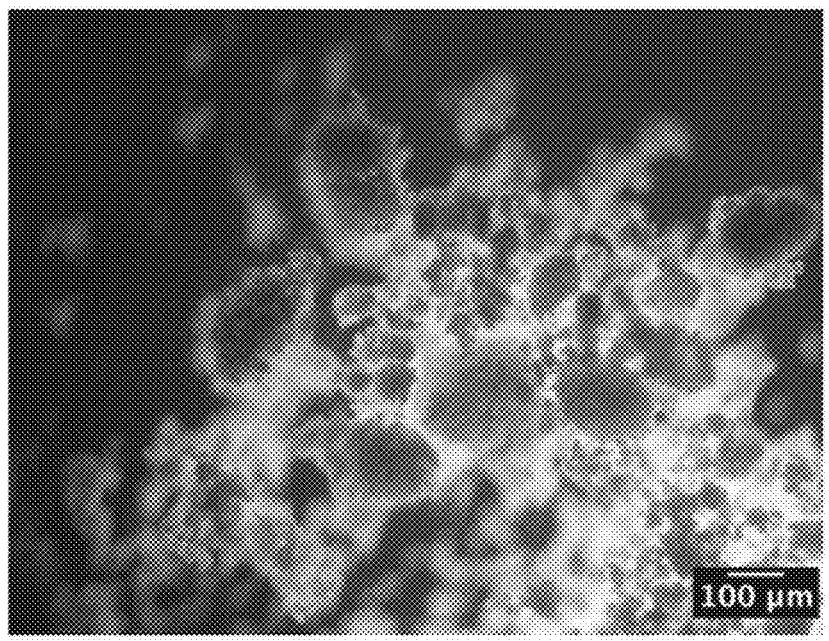
FIG. 3 (a) is an optical microscopic image of the commercial AgI powder as received.
Figure 3B:
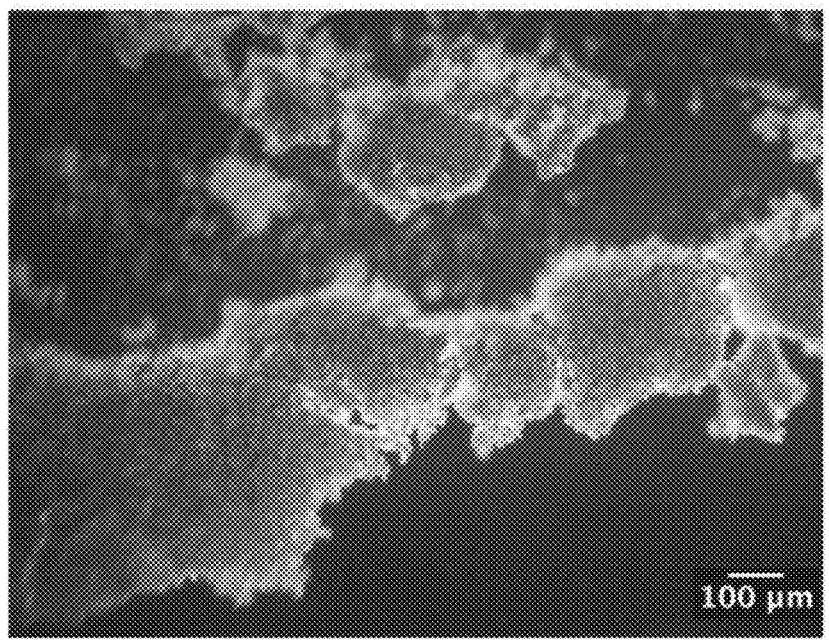

An embodiment AgI—$Al_2O_3$ ink for extrusion printing was prepared by ball milling solid AgI and different concentrations (0%, 20%, 40%, and 60%) of Almatis A16 $Al_2O_3$ (0.5 µm, α-phase) into a fine powder with 5 mm yttria-stabilized zirconia (YSZ) milling media in an ethanol dispersion. This powder was then dried overnight in an oven at 80° C. before being crushed and sieved through a #40 sieve (425 µm mesh size). The binder used for creating a paste was a 3.5:1, by mass, ratio of ESL ElectroScience 473 vehicle and 401 thinner. AgI and $Al_2O_3$ powder were integrated into this binder (65 wt % AgI—$Al_2O_3$) using a centrifugal planetary mixer which mixed these components at 2000 rpm for 1 min. The pastes were then placed in a BD 5 mL syringe, centrifuged at 2500 rpm for 1 min, and degassed in the planetary mixer for 1 min at 2000 rpm under vacuum. FIG. 3 (a) shows an optical microscope image of the as-received AgI powder and FIG. 3 (b) show the image of the powder after milling. The particles are more uniform in size after milling and are well dispersed.

Figure 4A:
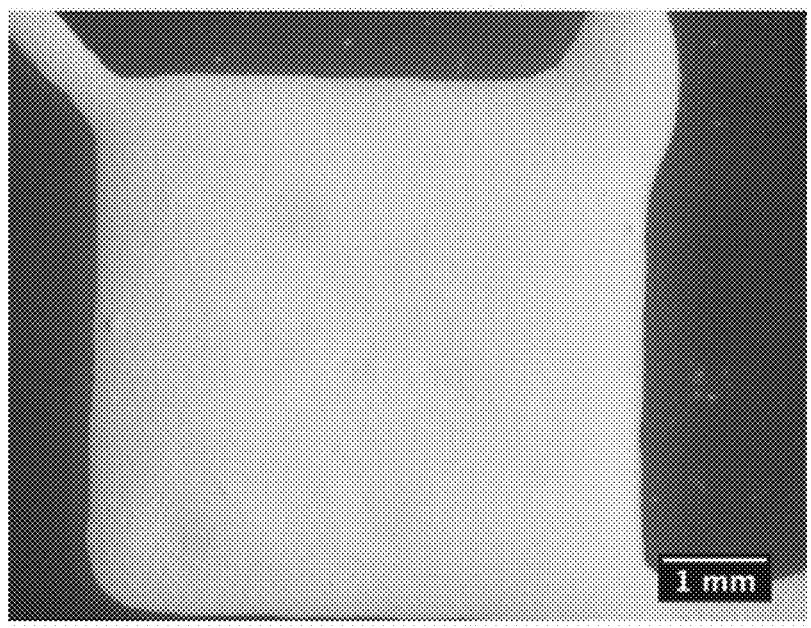
FIG. 4 (a) is an optical microscopic image at low magnification of the printed resistive switch after drying and before burnout/sintering.
Figure 4B:
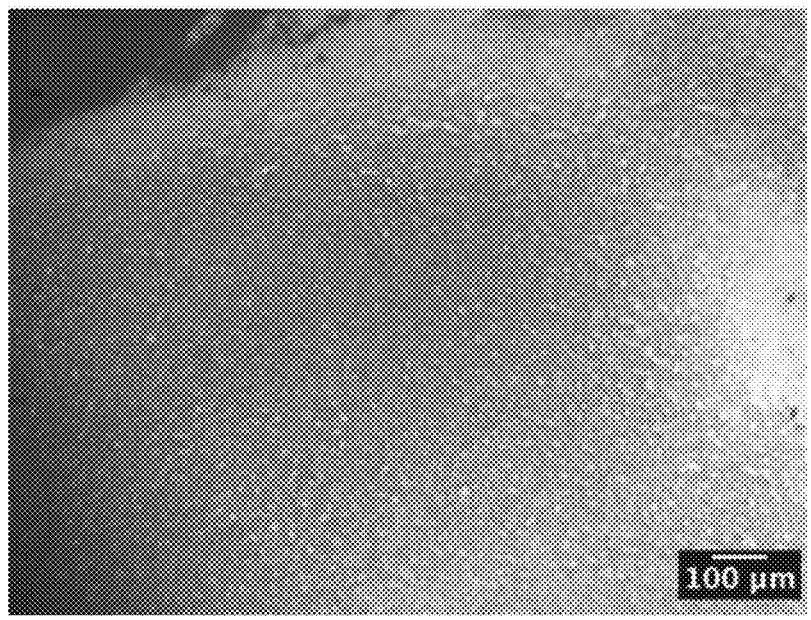

The paste was printed on glass slides using a Hyrel 30M printing system with a 0.41 mm syringe tip in patterns of 0.5 cm×0.5 cm squares using a one-layer print process. Prior to imaging, the printed slides were dried at 120° C. for 20 minutes. FIG. 4 (a) shows the optical images of the print at low magnification of millimeter scale, and FIG. 4 (b) shows the print at high magnification of micrometer scale. The printed layers are observed to have a highly uniform deposition, and do not show signs of agglomerates or the presence of large-sized particles.

Example 2: Method to Additively Manufacture a Resistive Switch

In an embodiment, a method to manufacture resistive switches involves using a combination clean room and additive manufacturing techniques. A resistive switch comprises a device stack with a glass substrate, a Ti adhesion layer, a first layer Pt electrode, a solid-state AgI electrolyte, a Ag electrode, and a second layer Pt backstop. After electron beam vapor depositing a 5 nm adhesion layer of Ti onto the glass substrate, a 50 nm first layer of Pt is electron beam vapor deposited on top of the Ti layer. Extrusion printing is then used to additively print a 100 µm layer of AgI onto the first Pt electrode layer.

The AgI ink used is prepared by ball milling solid AgI with 5 mm yttria-stabilized zirconia (YSZ) milling media in an ethanol dispersion to create a fine powder. This powder is then dried for 12 hours in an oven at 80° C. before being crushed and sieved through a #40 sieve (425 µm mesh size). Once dried, the sieved AgI powder is combined with a binder, consisting of a 3.5:1 by mass ratio of ElectroScience 473 vehicle and 401 thinner, to create the ink for extrusion printing. To combine the AgI with the binder, the AgI is mixed with the binder for 1 minute with a centrifugal planetary mixer set to 2000 rpm. The amount of AgI powder added to the binder is such that the resulting ink has a 65 wt % of AgI. To print this ink, a 0.41 mm nozzle is used and moved at a speed of 5 mm/s. Once printed, the AgI deposited is dried in an oven set at 120° C. for 20 minutes. The binder is then vaporized from the AgI by applying the following heat treatment: 1.0° C./min to 100° C. with a 2 hr hold at 100° C., 0.1° C./min to 200° C. with 2 hr hold at 200° C., 0.1° C./min ramp to 325° C. with 2 hr hold at 325° C., and then −3.0° C./min ramp to room temperature.

After extrusion printing the AgI electrolyte layer, shadow masking is then applied to electron beam vapor deposit a 50 nm layer of Ag onto the unbound AgI. Shadow masking is reapplied to electron bean vapor deposit a 50 nm second layer of Pt onto the Ag layer. A small amount of silver epoxy can be manually placed on top of the second Pt layer to reinforce the resistive switch and prevent puncturing when attaching electrical leads.

Example 3: Filament Formation and Switching

The resistive switches developed are wired by attaching an electrical lead to the first Pt layer and its paired lead to the Ag layer. When the Pt electrode is considered to be the ground, applying a positive voltage to the Ag layer causes a silver filament to grow in the AgI (or AgI—$Al_2O_3$) electrolyte layer. The silver filament in the electrolyte layer is believed to be formed by electroreduction of $Ag^+$ onto the Pt cathode, and the source of the electroplated Ag is believed to be mobile $Ag^+$ ions within the solid-state electrolyte and also can be from a reductive decomposition of the AgI electrolytes. To etch away the silver filament, a negative voltage is applied.

The specific voltages which need to be applied to transition between high and low electrical resistivity states will vary depending on the specific thicknesses of each layer. In this example, an initial +7 V was applied to cause the initial transition from a high to low electrical resistivity state. The low resistive state (forming the Ag filament in the electrolyte layer) can be restored to the high resistive state (breaking the Ag filament in the electrolyte layer), and also vice versa after it is restored. For example, after this initial priming, the low resistivity state, specifically a resistivity greater than $10^6$ Ω-cm, can be consistently restored to the high resistivity state by applying −3.5V to the device for 2 s. The low resistivity state, specifically a resistivity less than $10^4$ Ω-cm, can be consistently achieved by applying the voltage needed to drive a +5 mA of current through the device for 0.5 s to form the silver filament again. Other low resistivity states are achievable by applying the voltage needed to drive other positive currents.

If a positive charge is sustained for a longer period of time, multiple filaments may form for a single device, and the filament may become thicker as well.

Figure 5A:
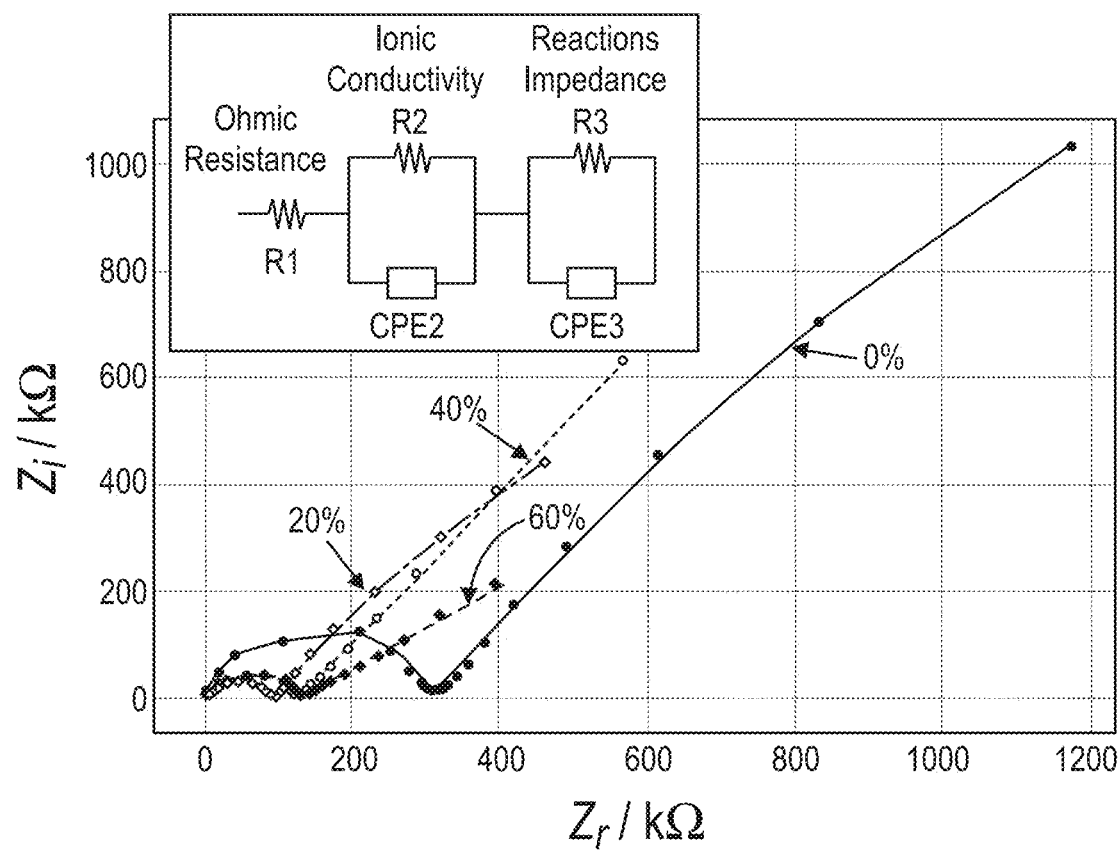
FIG. 5 (a) is a Nyquist plot of AgI—Al$_2$O$_3$ composites for 0%, 20%, 40% and 60% Al$_2$O$_3$ at room temperature.
Figure 5B:
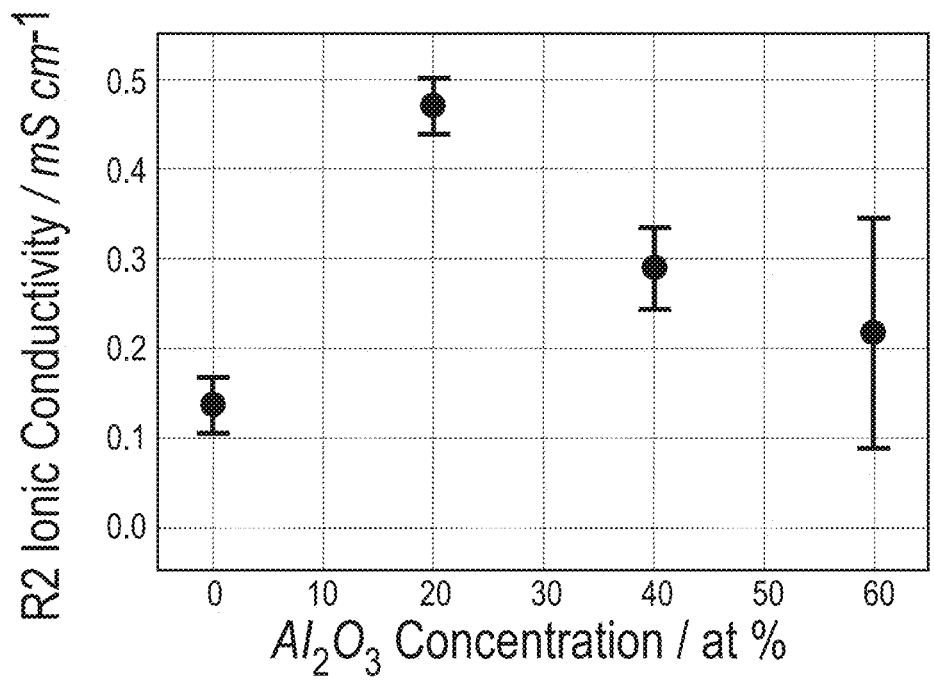
Figure 5C:
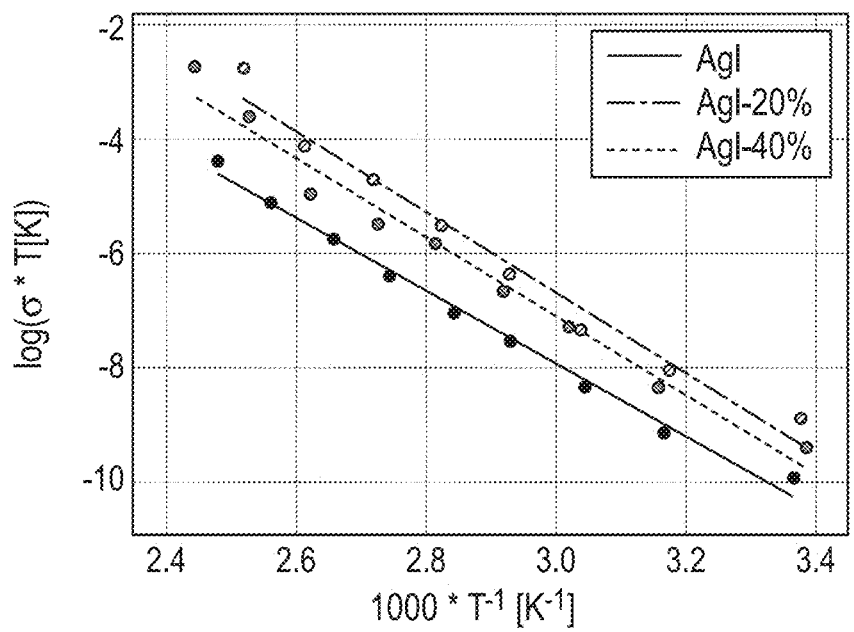

Example 4: Resistive Switches Having Additively Manufactured AgI and AgI—$Al_2O_3$ Composite Electrolytes FIG. 5 (a) shows a Nyquist plot of measurements using additively manufactured resistive switches that include different AgI—$Al_2O_3$ composite electrolyte layers at 0%, 20%, 40% and 60% weight percent of $Al_2O_3$ in the AgI—$Al_2O_3$ composites at room temperature, with an AC perturbation of 50 mV from 5 MHz to 0.1 Hz. In the diagram, (R) are resistors, and (CPE) are constant phase elements. FIG. 5 (b) plots the ionic conductivity of the different concentrations of $Al_2O_3$ composites obtained from the EIS data in FIG. 5 (a), with error bars. FIG. 5 (c) shows a chart of ionic conductivity as a function of temperature for pure AgI and AgI with 20% and 40% $Al_2O_3$ content by weight. As can be seen from the charts in FIGS. 5 (b) and 5 (c), the 0% $Al_2O_3$ composite, which is a pure AgI electrolyte layer, has the lowest ionic conductivity, while the other $Al_2O_3$ composites have higher ionic conductivity than the pure AgI electrolyte layer, with the highest conductivity being the 20% $Al_2O_3$ composite at about 4.5 times the conductivity of the pure AgI electrolyte layer.

Figure 6A:
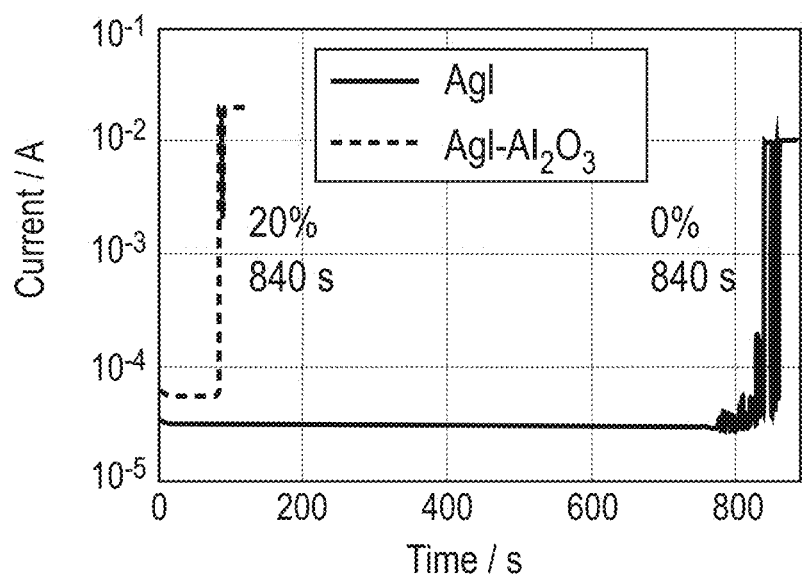
FIG. 6 (a) is a chart showing current as a function of time during the initial Ag filament formation through a AgI electrolyte and a AgI—Al$_2$O$_3$ (20% Al$_2$O$_3$) electrolyte.
Figure 6B:
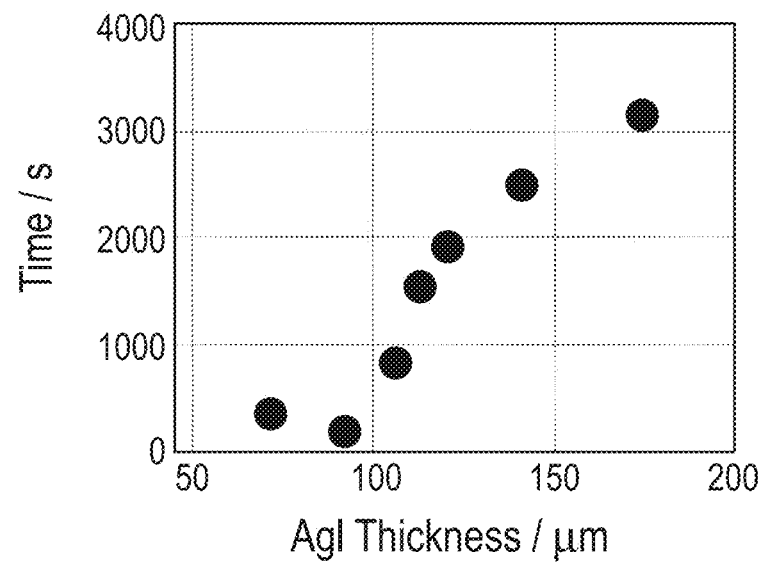
Figure 7A:
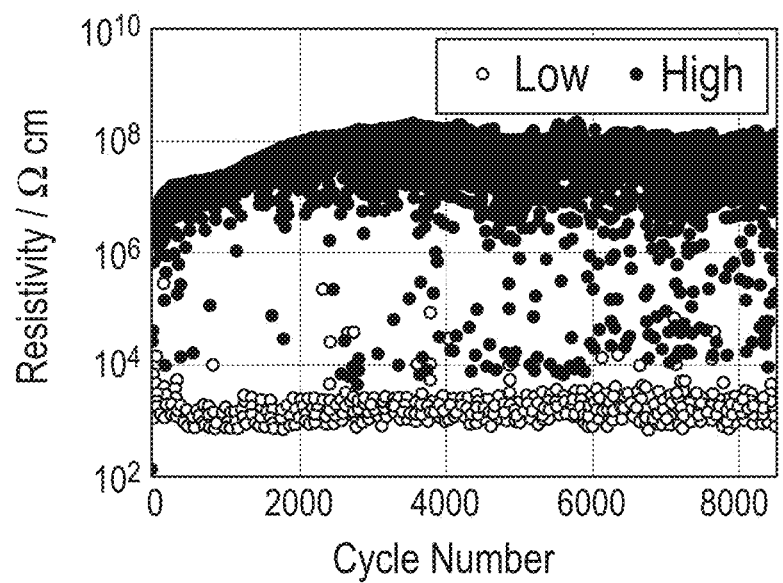
FIG. 7 (a) is a plot of measured high and low resistivities for a pure AgI device for 8,500 cycles.
Figure 7B:
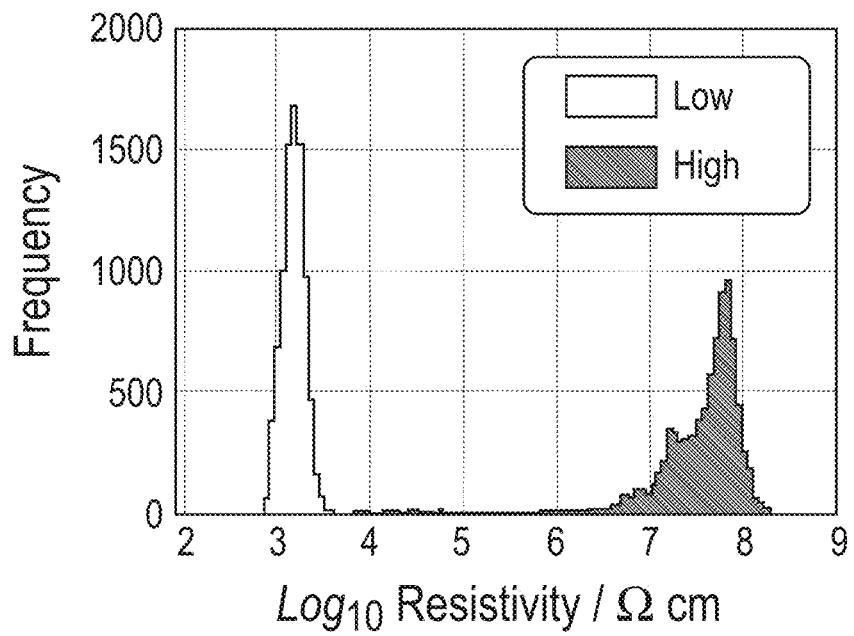
Figure 7C:
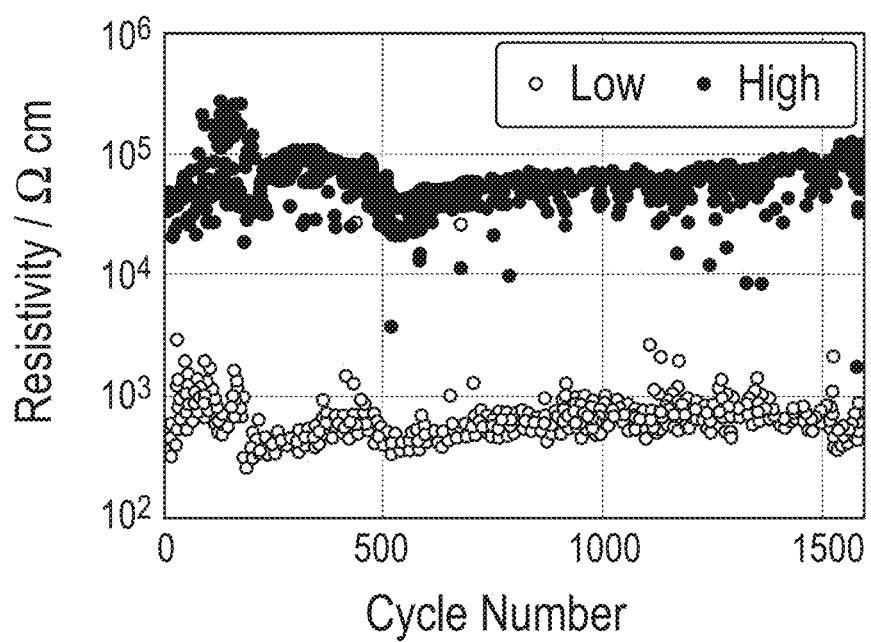
Figure 7D:
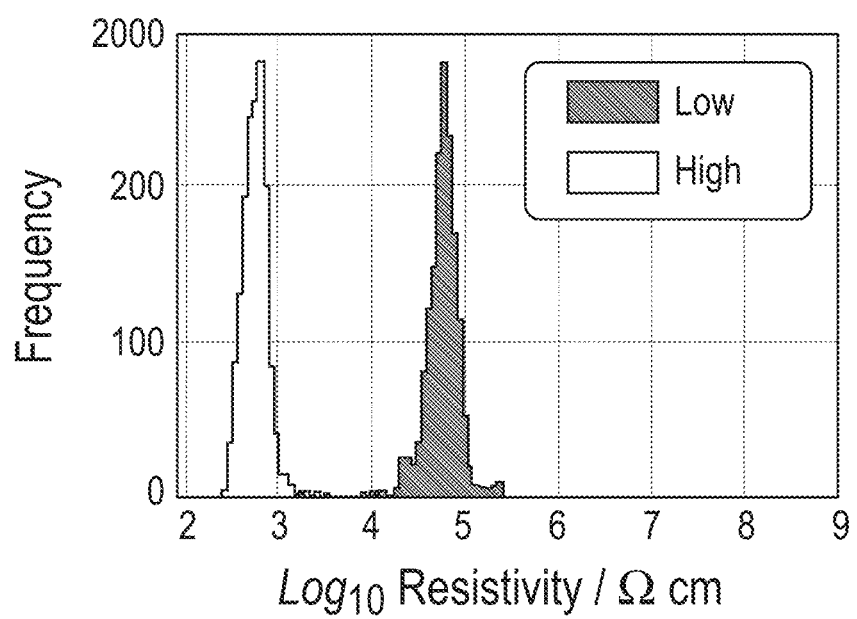

Filament formation in an embodiment resistive switch over time is shown in FIG. 6 (a). The average current measured through the pure AgI electrolyte was about 30 µA during filament formation, and the average current through the AgI—$Al_2O_3$ electrolytes were nearly double at about 56 µA. The filament in the pure AgI device in FIG. 6 (a) short circuited in 840 seconds, while the AgI—$Al_2O_3$ composite with 20% $Al_2O_3$ content shorted in 84 s. It can be seen that the higher ionic conductivity of the composite electrolyte leads to higher current during filament formation, resulting in faster formation times.

FIG. 6 (b) shows that filament formation time also correlates to the electrolyte layer thickness. FIG. 6 (b) shoes a linear relationship between AgI thickness and initial formation time. Although not shown in the graph, it was also observed that while the initial formation of the filament takes significantly longer than subsequent cycles, once the initial filament formation has taken place, subsequent reformations take less than 0.5 s. It is believed that the entire filament is not completely broken, that only the interface between the filament and the electrode is disrupted, when a negative potential is applied to break the filament and take the resistive switch from a low resistive state back to a high resistive state.

The ability for an embodiment additively manufactured resistive switch to switch between low and high electrical resistive states have been measured and plotted for comparison between pure AgI electrolyte embodiments and AgI—$Al_2O_3$ composite electrolyte embodiments. FIGS. 7 (a) and (b) plots the switching behavior for AgI electrolyte in an embodiment resistive switch, and FIGS. 7 (c) and (d) plots the switching behavior for AgI—$Al_2O_3$ composite electrolyte in an embodiment resistive switch. FIG. 7 (a) plots the measured high and low resistivities for a pure AgI device for 8,500 cycles, and the chart indicates stable resistivity for these states over the cycles. FIG. 7 (b) shows the distribution of high and low resistivities for a pure AgI device over 8,500 cycles, with nearly 5 orders of magnitude in the peak-to-peak separation. FIG. 7 (c) plots the measured high and low resistivities for a AgI—$Al_2O_3$ composite device that includes 20% $Al_2O_3$ content for 1,600 cycles. The composite switch failed shortly after 1,600 cycles by staying continuously in the low resistance state. Higher switching numbers may be possible after further careful optimization of the composite microstructure and switching voltages. FIG. 7 (d) shows a lower separation in the high and low resistive distribution than the pure AgI device.

In the example embodiments, both resistive switches that include additively manufactured pure AgI electrolytes and AgI—$Al_2O_3$ composite electrolytes have been shown to be effective solid electrolytes that provide efficient filament formations in the resistive switches. Using extrusion based additive manufacturing techniques to form electrolytes in a resistive switch, challenges in fabrication of resistive switches associated with the materials AgI (having relatively low decomposition temperature) and $Al_2O_3$ (having high vaporization temperature) can be overcome. Additive manufacturing techniques also allows quick prototyping and small-scale production of the resistive switches.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. $-1$, $-2$, $-3$, $-10$, $-20$, $-30$, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A resistive switch comprising:
    a first layer comprising platinum;
    a second layer comprising a solid-state electrolyte and $Al_2O_3$ in an amount up to about 40 mol % that is additively extruded on the first layer;
    a third layer comprising silver deposited on the second layer; and
    a fourth layer comprising platinum disposed on the third layer.

2. The resistive switch of claim 1 further comprising a substrate and an adhesion layer disposed on the substrate, wherein the first layer is deposited on the adhesion layer.

3. The resistive switch of claim 1 further comprising a substrate comprising glass and an adhesion layer comprising titanium disposed on the substrate, wherein the first layer, second, third and fourth layer are disposed perpendicular to the adhesion layer.

4. The resistive switch of claim 1, wherein the second layer further comprises $Al_2O_3$.

5. The resistive switch of claim 1, wherein the second layer further comprises $Al_2O_3$ in an amount of about 20 mol %.

6. A device comprising the resistive switch of claim 1, wherein the device is one of an inorganic analog to an electrical junction in a neuro-biological architectures, a resistive non-volatile digital memory, a low power non-volatile digital memory, a robust non-volatile digital memory, a reconfigurable circuitry, a regenerative fuse, or an anti-fuse.

7. The resistive switch of claim 1, further comprising a silver filament disposed in the second layer, wherein the silver filament extends from the first layer to the third layer.

8. The resistive switch of claim 7, wherein the silver filament is formed in the second layer by a voltage between the first layer acting as a first electrode, the third layer acting as a second electrode, and the second layer acting as a solid-state electrolyte for silver ion migration for growth of the silver filament.

9. The resistive switch of claim 7, wherein the silver filament is oxidatively dissolved by reversing the voltage.

* * * * *